(12) United States Patent
Hasbani et al.

(10) Patent No.: US 9,147,695 B2
(45) Date of Patent: Sep. 29, 2015

(54) DEVICE WITH FD-SOI CELL AND INSULATED SEMICONDUCTOR CONTACT REGION AND RELATED METHODS

(71) Applicant: STMICROELECTRONICS SA, Montrouge (FR)

(72) Inventors: Frédéric Hasbani, Hurtieres (FR); Eric Remond, Francin (FR)

(73) Assignee: STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 14/096,509

(22) Filed: Dec. 4, 2013

(65) Prior Publication Data

US 2014/0167167 A1    Jun. 19, 2014

(30) Foreign Application Priority Data

Dec. 14, 2012    (FR) ...................................... 12 62032

(51) Int. Cl.
*H01L 27/12* (2006.01)
*H01L 21/84* (2006.01)
*H01L 29/786* (2006.01)

(52) U.S. Cl.
CPC ............ *H01L 27/1203* (2013.01); *H01L 21/84* (2013.01); *H01L 29/78648* (2013.01)

(58) Field of Classification Search
CPC ............................ H01L 27/1203; H01L 21/84
USPC .......................................... 257/350; 438/152
See application file for complete search history.

(56) References Cited

U.S. PATENT DOCUMENTS

| 5,473,183 | A | * | 12/1995 | Yonemoto | ...................... 257/371 |
| 5,583,363 | A | * | 12/1996 | Momose et al. | ............... 257/378 |
| 6,023,186 | A | * | 2/2000 | Kuroda | ......................... 327/534 |
| 6,087,893 | A | | 7/2000 | Oowaki et al. | |
| 6,313,511 | B1 | | 11/2001 | Noguchi | |
| 2001/0045602 | A1 | | 11/2001 | Maeda et al. | |
| 2004/0155281 | A1 | * | 8/2004 | Osada et al. | .................. 257/315 |
| 2004/0262647 | A1 | | 12/2004 | Okihara | |
| 2004/0262693 | A1 | * | 12/2004 | Ohsawa | ........................ 257/369 |
| 2005/0006702 | A1 | | 1/2005 | Baba | |
| 2007/0063284 | A1 | | 3/2007 | Kawahara et al. | |
| 2007/0158747 | A1 | | 7/2007 | Cai et al. | |
| 2008/0116939 | A1 | | 5/2008 | Takizawa | |
| 2012/0018807 | A1 | | 1/2012 | Tsuchiya et al. | |
| 2012/0146148 | A1 | | 6/2012 | Iwamatsu | |
| 2012/0299105 | A1 | * | 11/2012 | Cai et al. | ........................ 257/348 |

FOREIGN PATENT DOCUMENTS

| EP | 1744364 | A2 | 1/2007 |
| EP | 1906440 | A1 | 4/2008 |
| JP | 2002270698 | A | 9/2002 |
| JP | 2006165808 | A | 6/2006 |
| JP | 2012015538 | A | 1/2012 |
| JP | 2012028665 | A | 2/2012 |
| JP | 2012099554 | A | 5/2012 |

* cited by examiner

*Primary Examiner* — Bilkis Jahan
(74) *Attorney, Agent, or Firm* — Allen, Dyer, Doppelt, Milbrath & Gilchrist, P.A.

(57) ABSTRACT

An integrated cell may include an nMOS transistor, and an pMOS transistor. The cell may be produced in fully depleted silicon-on-insulator technology, and it is possible for the substrates of the transistors of the cell to be biased with the same adjustable biasing voltage.

15 Claims, 4 Drawing Sheets

ND INSULATED SEMICONDUCTOR CONTACT
DEVICE WITH FD-SOI CELL AND INSULATED SEMICONDUCTOR CONTACT REGION AND RELATED METHODS

TECHNICAL FIELD

The present disclosure relates to electronic devices and, more particularly, to integrated complementary metal-oxide-semiconductor (CMOS) cells produced in fully depleted silicon-on-insulator (FD-SOI) technology.

BACKGROUND

Relative to a bulk substrate, fully depleted silicon-on-insulator technology (i.e. FD-SOI technology) is based on the concept of depositing a very thin silicon layer on a buried layer of insulating oxide supported by an underlying substrate, for example, a well. This technology can be used to obtain properties of low power consumption and may operate at very low supply voltages.

SUMMARY

According to one aspect, an electronic device may comprise at least one integrated cell comprising at least one nMOS transistor and at least one pMOS transistor. The at least one cell may be produced in FD-SOI technology, and it is possible for the substrates of the transistors of the at least one cell to be biased with the same adjustable biasing voltage (Vbias). This voltage is intended to be received by an input (EPL) for biasing the cell.

Being able to bias the substrates of all of the transistors of the cell with the same biasing voltage may have many advantages. It is thus possible, for example, to increase the threshold voltage of the pMOS transistor and simultaneously decrease the threshold voltage of the nMOS transistor until, if necessary, these threshold voltages equal each other. It is also possible to balance various parameters of these nMOS and pMOS transistors, for example, their on-state currents, their off-state currents, or even their switching speeds.

According to one embodiment, the device may comprise a semiconductor well, a fully depleted upper silicon layer comprising semiconductor source and drain regions and the fully depleted channel regions of the transistors of the at least one cell, and an insulating region located between the well and the silicon layer. The semiconductor well may be common to the transistors of the cell and possess a buried control electrode region common to the transistors, it being possible to bias the control electrode region with the adjustable biasing voltage.

Using a common well and a buried control electrode common to the transistors of the cell may allow the footprint to be reduced. And this is all the more advantageous when the well and the buried control electrode are common to a plurality of cells. Moreover, although it is possible to separate the various transistors of a cell, for example, with shallow trench isolation regions, it may be advantageous, especially in order to further reduce the footprint, for the semiconductor source or drain regions of the at least two nMOS and pMOS transistors to adjoin each other.

Although it is not necessary, an electrically conductive connection, for example, a silicide zone or a "contact and metallization" assembly, connecting two respective source or drain regions of two transistors may be provided. This connection may be employed when the cell is configured as an inverter. According to another embodiment, the biasing input of the at least one cell may comprise a semiconductor contact region, electrically insulated from the at least one cell, making contact with the well through the insulating region.

BRIEF DESCRIPTION OF THE DRAWINGS

Other advantages, features and applications of the present disclosure will become apparent on examining the following detailed description of non-limiting embodiments, and the appended drawings in which.

DETAILED DESCRIPTION

Figure 1:
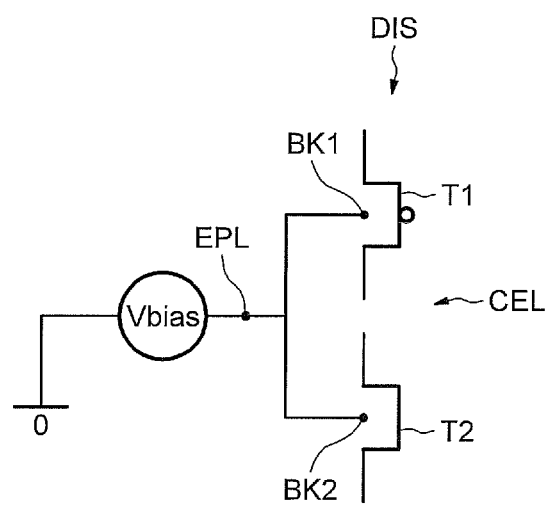
FIG. 1 is a schematic circuit diagram of an embodiment of a cell.

In FIG. 1, the reference DIS denotes an electronic device comprising a cell CEL. This cell CEL is an integrated cell produced in FD-SOI technology. Here, it comprises an nMOS transistor and a pMOS transistor. This being so, such a cell may comprise a plurality of pMOS transistors and/or a plurality of nMOS transistors. In any case, it is possible to bias the bulks/bodies (substrates) BK1, BK2 of all the transistors of the cell with the same adjustable biasing voltage Vbias. This voltage is intended to be received by a biasing input EPL of the cell.

The transistors of a given cell may be separated from each other by isolating regions, though at least some of these transistors may be adjoined. Likewise, depending on the use of the cell, certain electrodes of the transistors may optionally be electrically connected.

Moreover, the device may comprise a plurality of cells CEL, for example, separated from each other by shallow trench isolation (STI). The biasing inputs of these various cells may receive the same biasing voltage Vbias, especially if all the cells are placed above a given semiconductor well and possess the same buried control electrode. This being so, if the cells are produced on various semiconductor wells that are electrically isolated from one another, the biasing voltages may be different from one cell to another.

Figure 2:
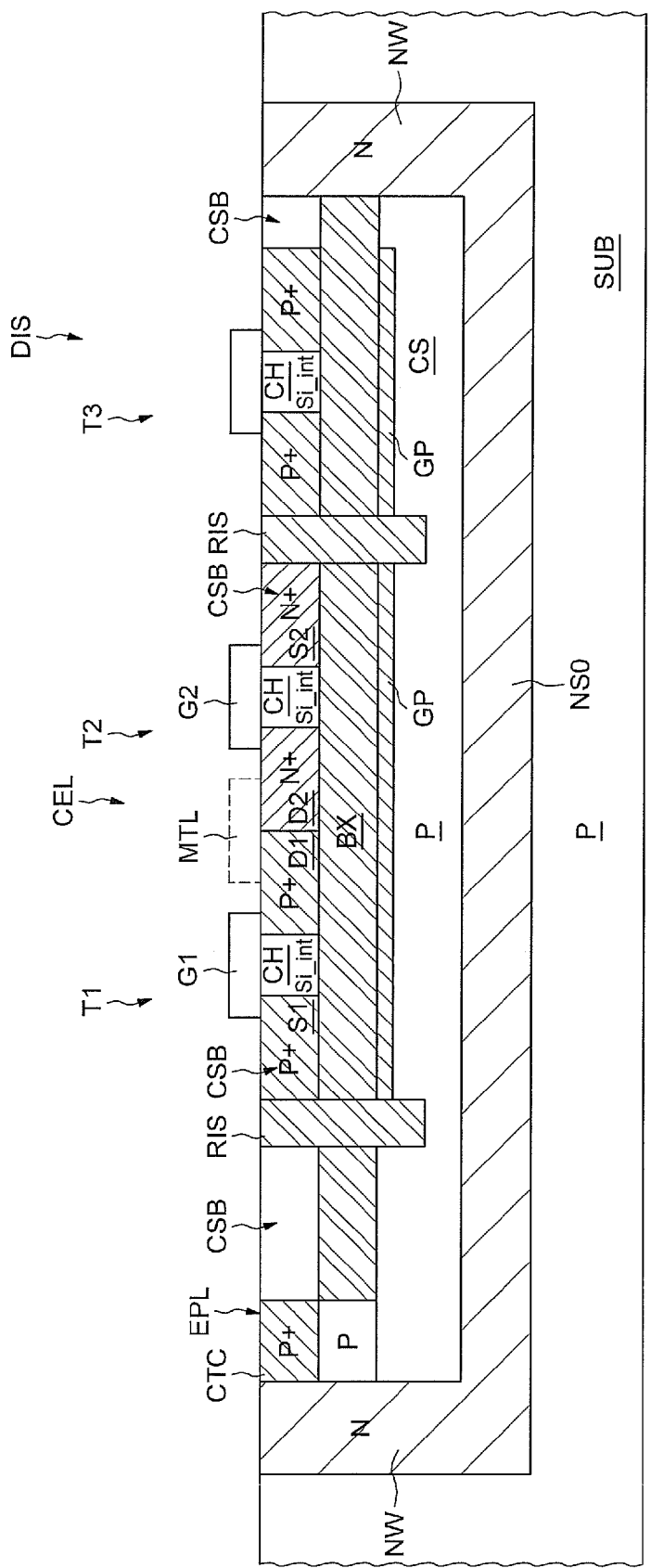
FIG. 2 is a schematic diagram of a cross-section view of an embodiment of a cell.

FIG. 2 illustrates a cross-section of one embodiment of a cell CEL having a particularly small footprint. In the example described here, the cell CEL comprises a pMOS transistor T1 and an nMOS transistor T2. A well CS, here of p-type conductivity, is electrically isolated from another substrate SUB portion, also with p-type conductivity, located outside of the well CS, by a semiconductor region of n-type conductivity comprising a buried layer NSO and barriers NW.

Specifically, the potential of the well CS may be higher than that of the underlying substrate SUB. This is the reason why the well CS is isolated from the underlying substrate SUB. In this respect, the region NSO, NW will, for example, be biased with a voltage higher than or equal to the voltage Vbias in order to prevent the corresponding p-n diode (well CS/region NSO, NW) from turning on.

The device comprises, above the well CS, an insulating region BX supporting an upper silicon layer CSB. The transistor T1 typically comprises a drain region D1, a source region S1, both of which are p+doped, and a gate region G1, which may for example either be p+doped or made of a metal. Likewise, the transistor T2 typically comprises a drain region D2, a source region S2, both of which are n+doped, and a gate region G2, which may, for example, either be n–doped or made of a metal.

The source and drain regions of the transistors, produced, for example, by localized implantation of dopants into the layer CSB, extend as far as the buried insulating layer BX. This is FD-SOI technology because the channel region CH located under the gate of the corresponding transistor, and which extends as far as the buried layer BX, is a region of intrinsic silicon Si_int, i.e. an undoped region. The cell CEL, which comprises the two transistors T1 and T2, is bounded laterally by an isolating region RIS, for example, an STI region.

Moreover, the well CS is common to the transistors Ti and T2 of the cell CEL and possesses a buried control electrode region GP that is also common to the transistors T1 and T2 and that can be biased with the adjustable biasing voltage Vbias. More precisely, in this respect, the biasing input EPL of the cell CEL here comprises a p+-doped semiconductor contact region CTC that is electrically insulated from the cell CEL. This semiconductor region CTC is placed beyond the lateral isolating region RIS. This region CTC moreover makes contact with the well CS through the buried insulating region BX, by way of a hole housed in this region BX.

In FIG. 2, although, with regards to the transistor T1, the right-side p+doped region is the drain region and the left-side p+doped region is the source region, and, with regards to the transistor T2, the left-side n+doped region is the drain region, and the right-side n+doped region is the source region. The source and drain regions could be switched for at least one of these transistors.

In any case, in this embodiment the transistors T1 and T2 are joined, i.e. in this embodiment, the two drain regions D1 and D2 of the two transistors T1 and T2 adjoin each other. Therefore, in this way, a cell CEL that is very compact in terms of footprint is obtained.

Moreover, depending on the use of the cell CEL, an electrically conductive connection MTL may be provided between the two electrode regions of the two transistors T1 and T2. This electrically conductive connection may comprise a silicide zone extending over the two electrode regions in question, in this case the two drain regions D1 and D2 of the two transistors T1 and T2, or even comprise metal contacts connected by a metallization located in the first metallization level of the integrated circuit. The device DIS may comprise, outside of the cell CEL, other components such as, for example, pMOS transistors T3, or even other cells CEL, which will then all share the same well CS and therefore the common buried control electrodes GP.

Figure 3:
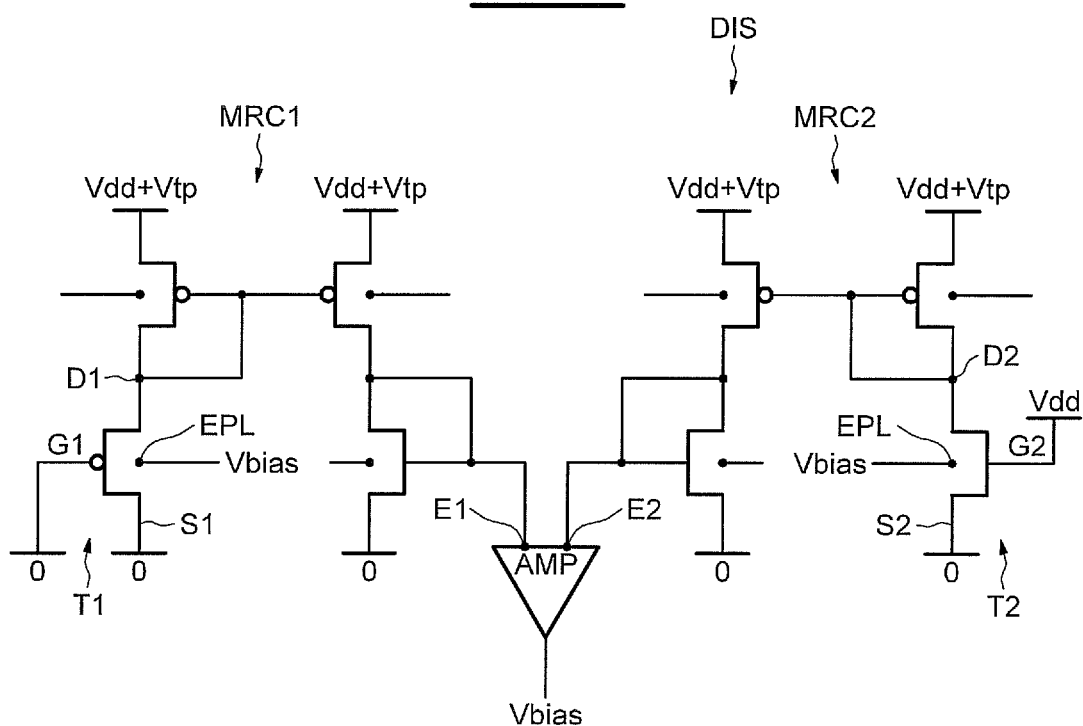
FIGS. 3-7 are schematic circuit diagrams of various embodiments of a device with different applications of the cells.

Referring now to FIGS. 3-7, various possible applications of one or two cells according to the present embodiments are now described. In FIG. 3, the device DIS comprises a first current copying (i.e. current mirror) circuit or first current copying means MRC1 having a typical structure connected between the drain D1 of the transistor T1 of a cell CEL and the first input E1 of a differential amplifier AMP. Likewise, a second current copying circuit (i.e. current mirror) or second current copying means MRC2 is connected between the drain D2 of the transistor T2 of the cell CEL, for example, and the second input E2 the differential amplifier AMP.

The output of the differential amplifier AMP, which delivers the adjustable biasing voltage Vbias, is connected to the biasing input EPL of the cell. Moreover, the sources S1 and S2 of the two transistors T1 and T2 are grounded and, in the example described here, the gate G1 of the transistor T1 is grounded whereas the gate G2 of the transistor T2 is connected to the supply voltage Vdd. Therefore, the two transistors T1 and T2 are saturated.

The circuit illustrated in FIG. 3 therefore allows, via this adjustment loop, a voltage Vbias to be delivered to the biasing input EPL such that the on-state currents Ion of the transistors are substantially equal. This embodiment therefore allows the currents Ion of the nMOS and pMOS transistors to be balanced based on a comparison of the drain saturation currents.

Of course, the transistors T1 and T2 may belong to two different cells. And, in this case, since the voltage Vbias is common to all the buried control electrodes GP of all the transistors located above the same well, the currents Ion of all the nMOS and pMOS transistors, the buried control electrodes of which receive the voltage Vbias, are balanced.

Figure 4:
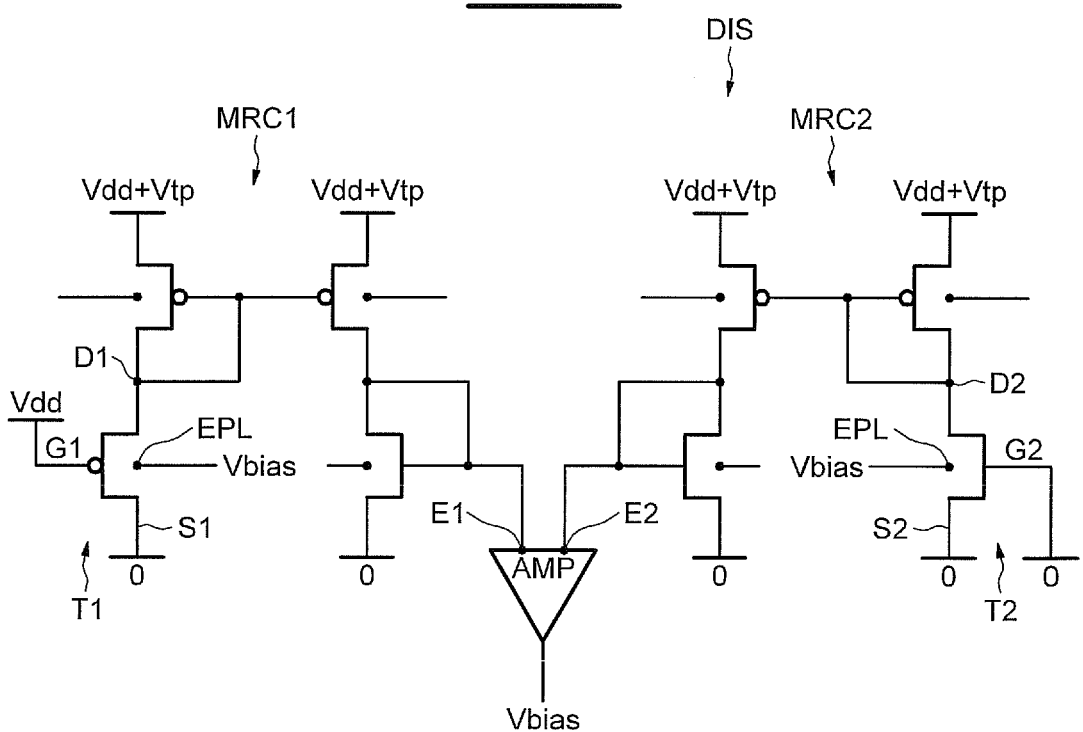

The device DIS in FIG. 4 has an analogous structure to that of the device in FIG. 3. In contrast, in this figure, the gate G1 of the pMOS transistor is this time connected to the supply voltage Vdd whereas the gate G2 of the nMOS transistor is this time grounded. These transistors are therefore turned off. The adjustment loop of FIG. 4 thus allows the off-state currents Ioff of the nMOS and pMOS transistors to be balanced on the basis of a comparison of the leakage from the channels of these transistors.

Figure 5:
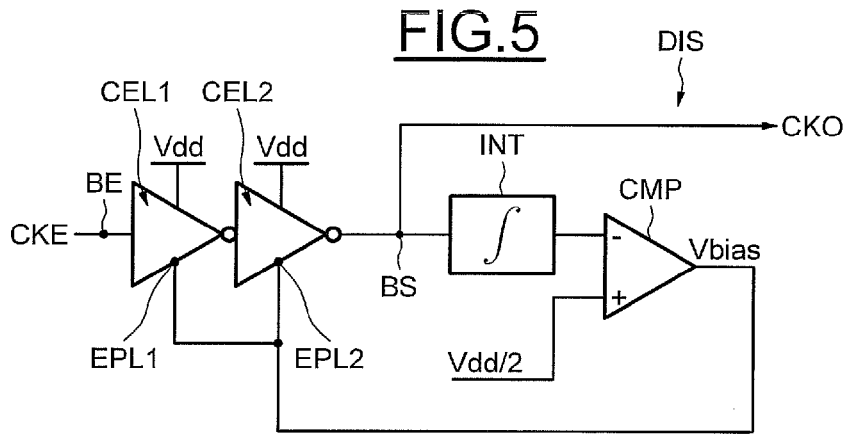

In FIG. 5, the device DIS comprises a sequence of cells, here two cells, CEL1 and CEL2, connected in series. The drains of the nMOS and pMOS transistors of each cell are electrically connected and the gates of these two transistors are also electrically connected in order to form an inverter. The input of the first inverter CEL1 is connected to an input terminal BE intended to receive, for example, an input clock signal CKE having an unbalanced duty cycle, i.e. a duty cycle different from 50%. The output of the last inverter CEL2 of the sequence is connected to an output terminal BS delivering an output clock signal CKO. The two inverters are supplied with the supply voltage Vdd (the sources of the pMOS transistors are connected to the voltage Vdd and the sources of the nMOS transistors are grounded).

Moreover, the device DIS comprises an integrator INT, having a typical structure, the input of which is connected to the output terminal BS and the output of which is connected to a first input, here the − input, of a comparator CMP. The other input, here the + input, of the comparator CMP is connected to a reference voltage equal to half the supply voltage Vdd. The output of the comparator is connected to the biasing inputs EPL1 and EPL2 of the cells CEL1 and CEL2.

This adjustment loop then allows the comparator CMP to deliver the biasing voltage Vbias such that the two inputs of the comparator are substantially equal to Vdd/2. And, in this case, the output clock signal CKO has a duty cycle equal or very near to 50%. The adjustable biasing voltage Vbias here allows the switching speeds of the pMOS and nMOS transistors of the cells to be balanced.

Although in theory, it is enough to use a single inverter if the imbalance in the duty cycle of the clock signal CKO is very small, in practice, a plurality of inverters will be used and the number of inverters will be chosen depending on the expected size of the imbalance in the duty cycle of the clock signal CKE. Of course, although two separate cells have been shown in FIG. 5, it would have been possible to use two pairs of nMOS and pMOS transistors produced in the same cell.

Figure 6:
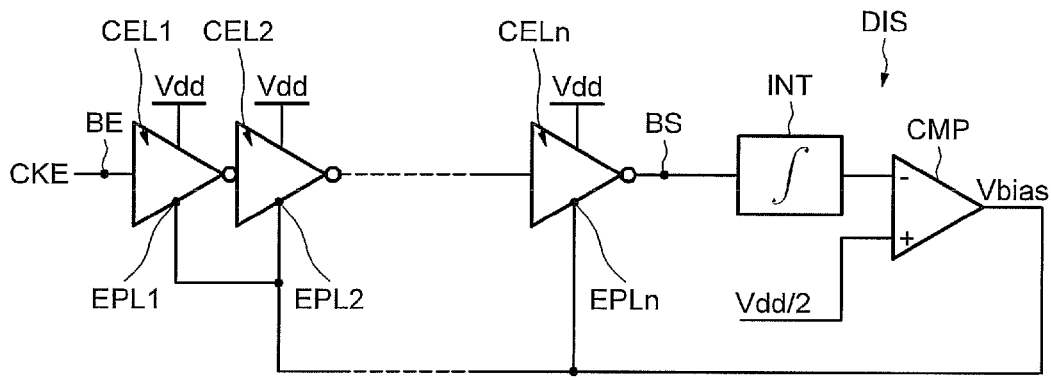

FIG. 6 shows a sequence CEL1-CELn of cells, each of which is configured as an inverter, forming a chain for propagating a clock signal received by the input terminal BE of the sequence. The input signal received by the input terminal BE is meant to have a duty cycle equal to 50%. The assembly of FIG. 5 comprises the integrator INT, and the comparator CMP is also connected between the output terminal BS (output of the last inverter CELn) and the biasing inputs EPL1-EPLn of the various cells.

Here again, this adjustment loop will make it possible to compensate for possible imbalances in the inverters from which the propagation chain is formed so that a clock signal having a duty cycle that is equal or very near to 50% will always be delivered. Typically, to generate with precision a clock signal having a duty cycle of 50%, for example, in a phase lock loop of an oscillator, the oscillator is made to operate at double the frequency of the clock signal, then the signal obtained is divided by two. However, such an approach consumes power and requires the use of fast dividers, which also consume power.

Figure 7:
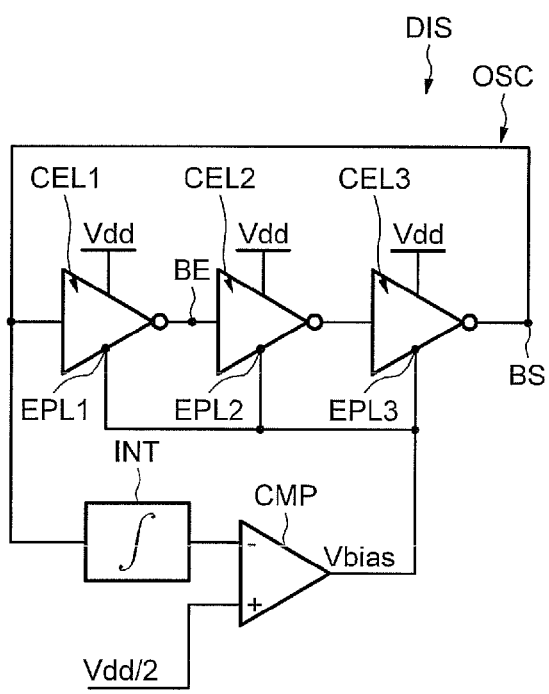

The embodiment in FIG. 7 allows a clock signal having a duty cycle of 50% to be generated, thereby obviating the use of fast dividers and making operation of the oscillator at double the frequency of the clock signal redundant. More precisely, the device DIS in FIG. 7 comprises a ring oscillator OSC formed by a plurality of cells (here three cells) CEL1-CEL3 configured as inverters. The oscillator OSC comprises an input terminal BE for receiving an input clock signal and an output terminal BS for delivering an output clock signal. Here again, each inverter is intended to be supplied with the supply voltage Vdd. FIG. 7 also shows the adjustment loop comprising the integrator INT connected to the output terminal BS, and the comparator CMP, which compares the value of the voltage delivered by the integrator INT with the reference value Vdd/2 and which delivers the adjustable biasing voltage Vbias to the inputs EPL1, EPL2 and EPL3 of the cells CEL1, CEL2 and CEL3.

That which is claimed is:

1. A device comprising:
    at least one fully depleted silicon-on-insulator (FD-SOI) cell comprising
        at least one first metal-oxide-semiconductor (MOS) transistor having a body and a first conductivity type,
        at least one second metal-oxide-semiconductor (MOS) transistor having a body and a second conductivity type different from the first conductivity type,
        a bias input terminal coupled to said bodies of said at least one first MOS transistor and said at least one second MOS transistor and configured to apply a same first adjustable biasing voltage,
        a semiconductor well having a buried control electrode region common to said at least one first MOS transistor and said at least one second MOS transistor and configured to be biased with the same first adjustable biasing voltage,
        an upper silicon layer comprising source and drain regions, and fully depleted channel regions associated with said at least one first MOS transistor and said at least one second MOS transistor, and
        an insulating region between said semiconductor well and said upper silicon layer; and
    an other body portion outside of said semiconductor well; and
    a first conductivity type semiconductor region insulating said semiconductor well from said other body portion and to be biased with a second voltage greater than or equal to the same first adjustable biasing voltage;
    said bias input terminal comprising a semiconductor contact region insulated from said at least one FD-SOI cell and contacting with said semiconductor well by extending between said insulating region and said first conductivity type semiconductor region.

2. The device according to claim 1 wherein said source or drain regions of said at least one first MOS transistor and said at least one second MOS transistor adjoin each other.

3. The device according to claim 1 further comprising an electrically conductive layer coupling respective source or drain regions of said at least one first MOS transistor and said at least one second MOS transistor.

4. The device according to claim 1 wherein said semiconductor well has the second conductivity type.

5. The device according to claim 1 further comprising:
    a first current mirror circuit coupled to said drain region of said at least one first MOS transistor;
    a second current mirror circuit coupled to said drain region of said at least one second MOS transistor; and
    an amplifier having first and second inputs respectively coupled to outputs of said first and second current mirror circuits, and an output coupled to said bias input terminal.

6. The device according to claim 1 wherein said at least one FD-SOI cell comprises a plurality thereof, each FD-SOI cell comprising a gate region; and further comprising an input terminal configured to receive an input clock signal, and an output terminal configured to deliver an output clock signal; wherein said drain regions of said at least one first MOS transistor and said at least one second MOS transistor of each cell are coupled and the gate regions of said at least one first MOS transistor and said at least one second MOS transistor of each cell are coupled to define an inverter, the plurality of FD-SOI cells defining first and second inverters.

7. The device according to claim 6 wherein an input of the first inverter is coupled to said input terminal, and an output of said second inverter is coupled to said output terminal, each inverter configured to be supplied with a supply voltage; and further comprising:
    an integrator having an input coupled to said output terminal; and
    a comparator having a first input coupled to an output of said integrator, a second input configured to receive a reference voltage equal to half the supply voltage, and an output coupled to said bias input terminal of said plurality of FD-SOI cells.

8. The device according to claim 7 wherein said plurality of FD-SOI cells is configured to define a ring oscillator.

9. A method of making an electronic device comprising:
    forming at least one fully depleted silicon-on-insulator (FD-SOI) cell comprising
        at least one first metal-oxide-semiconductor (MOS) transistor having a body and a first conductivity type,
        at least one second metal-oxide-semiconductor (MOS) transistor having a body and a second conductivity type different from the first conductivity type,
        a bias input terminal coupled to the bodies of the at least one first MOS transistor and the at least one second MOS transistor and to apply a same first adjustable biasing voltage,
        a semiconductor well having a buried control electrode region common to the at least one first MOS transistor and the at least one second MOS transistor and being biased with the same first adjustable biasing voltage,
        an upper silicon layer comprising source and drain regions, and fully depleted channel regions associated with the at least one first MOS transistor and the at least one second MOS transistor, and
        an insulating region between the semiconductor well and the upper silicon layer;
    forming an other body portion outside of the semiconductor well; and
    forming a first conductivity type semiconductor region insulating the semiconductor well from the other body portion and to be biased with a second voltage greater than or equal to the same first adjustable biasing voltage;

the bias input terminal comprising a semiconductor contact region insulated from the at least one FD-SOI cell and contacting with the semiconductor well by extending between the insulating region and the first conductivity type semiconductor region.

10. The method according to claim 9 further comprising forming the source or drain regions of the at least one first MOS transistor and the at least one second MOS transistor to adjoin each other.

11. The method according to claim 9 further comprising forming an electrically conductive layer coupling respective source or drain regions of the at least one first MOS transistor and the at least one second MOS transistor.

12. The method according to claim 9 wherein the semiconductor well has the second conductivity type.

13. The method according to claim 9 further comprising:
coupling a first current mirror circuit to the drain region of the at least one first MOS transistor;
coupling a second current mirror circuit to the drain region of the at least one second MOS transistor; and
coupling an amplifier to have first and second inputs respectively coupled to outputs of the first and second current mirror circuits, and an output coupled to the bias input terminal.

14. The method according to claim 9 wherein the at least one FD-SOI cell comprises a plurality thereof, each FD-SOI cell comprising a gate region; and further comprising coupling an input terminal to receive an input clock signal, and an output terminal to deliver an output clock signal; wherein the drain regions of the at least one first MOS transistor and the at least one second MOS transistor of each cell are coupled and the gate regions of the at least one first MOS transistor and the at least one second MOS transistor of each cell are coupled to define an inverter, the plurality of FD-SOI cells defining first and second inverters.

15. The method according to claim 14 wherein an input of the first inverter is coupled to the input terminal, and an output of the second inverter is coupled to the output terminal, each inverter to be supplied with a supply voltage; and further comprising:
coupling an integrator to have an input coupled to the output terminal; and
coupling a comparator to have a first input coupled to an output of the integrator, a second input to receive a reference voltage equal to half the supply voltage, and an output coupled to the bias input terminal of the plurality of FD-SOI cells.

* * * * *